(12) United States Patent
Pu et al.

(10) Patent No.: US 10,432,197 B2
(45) Date of Patent: Oct. 1, 2019

(54) ELECTRONIC DEVICES EMPLOYING ADIABATIC LOGIC CIRCUITS WITH WIRELESS CHARGING

(71) Applicant: QUALCOMM Incorporated, San Diego, CA (US)

(72) Inventors: Yu Pu, San Diego, CA (US); Giby Samson, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 350 days.

(21) Appl. No.: 15/230,885

(22) Filed: Aug. 8, 2016

(65) Prior Publication Data
US 2018/0041210 A1    Feb. 8, 2018

(51) Int. Cl.
*H03K 19/00* (2006.01)
*H02J 7/02* (2016.01)
(Continued)

(52) U.S. Cl.
CPC .......... *H03K 19/0019* (2013.01); *H02J 7/025* (2013.01); *H03K 19/01707* (2013.01); *H02J 50/10* (2016.02)

(58) Field of Classification Search
CPC .......... H03K 19/0019; H03K 19/01707; H02J 50/10; H02J 7/025
(Continued)

(56) References Cited

U.S. PATENT DOCUMENTS 8,258,771 B2 *  9/2012  Sato ..................... H02M 3/155
                                                          323/318
8,390,311 B2 *  3/2013  Kyue ................. H03K 19/0019
                                                          326/8
(Continued)

FOREIGN PATENT DOCUMENTS

EP      0851587 A2    7/1998
WO   2010022181 A1    2/2010
WO   2015191612 A1   12/2015

OTHER PUBLICATIONS

Akers, L. A. et al., "Adiabatic Circuits for Low Power Logic," 2002 45th Midwest Symposium on Circuits and Systems, vol. 2, 2002, IEEE, pp. II-286-II-289.
(Continued)

*Primary Examiner* — M Baye Diao
(74) *Attorney, Agent, or Firm* — W&T/Qualcomm

(57) ABSTRACT

Electronic devices employing adiabatic logic circuits with wireless charging are disclosed. In one aspect, an electronic device is provided. The electronic device includes a power circuit employing an alternating current (AC) coupler circuit configured to receive a wireless AC signal and generate a wired AC signal based on the wireless AC signal. The power circuit includes a power output configured to provide an AC power signal based on the wired AC signal generated by the AC coupler circuit. The AC power signal is generated based on the wireless charging capability of the AC coupler circuit. The electronic device employs a digital logic system that includes a power rail electrically coupled to an adiabatic
(Continued)

logic circuit. The AC power signal is provided to the power rail to provide power to the adiabatic logic circuit. Wirelessly charging the adiabatic logic circuit consumes less power than conventional non-wireless charging circuitry.

14 Claims, 6 Drawing Sheets

(51) Int. Cl.
*H02J 50/10* (2016.01)
*H03K 19/017* (2006.01)

(58) Field of Classification Search
USPC .......................................... 320/108
See application file for complete search history.

(56) References Cited

U.S. PATENT DOCUMENTS

| | | | | |
|---|---|---|---|---|
| 8,491,159 | B2* | 7/2013 | Recker | H02J 7/025 362/276 |
| 8,836,172 | B2 | 9/2014 | Hamam et al. | |
| 8,982,528 | B2* | 3/2015 | Fanet | H03K 19/02 361/211 |
| 9,257,981 | B2* | 2/2016 | Fanet | H03K 19/0019 |
| 9,312,776 | B2* | 4/2016 | Freeman | H02M 1/08 |
| 2011/0121813 | A1 | 5/2011 | Sato et al. | |
| 2012/0319498 | A1 | 12/2012 | Silberberg et al. | |
| 2013/0099584 | A1 | 4/2013 | Von Novak, III | |
| 2014/0097870 | A1 | 4/2014 | Despont et al. | |
| 2016/0087480 | A1* | 3/2016 | Trudeau | H02J 7/025 320/108 |

OTHER PUBLICATIONS

Gojman, Benjamin, "Adiabatic Logic," California Institute of Technology, Aug. 8, 2004, 5 pages.
Rangelov, A. A. et al., "Wireless adiabatic power transfer," Annals of Physics, vol. 326, No. 3, Mar. 2011, pp. 626-633.
Schrom, G., "D.2 Adiabatic CMOS," Ultra-Low-Power CMOS Technology, Dissertation, Jun. 1998, 1 page.
Teichmann, Philip, "Chapter 4: Generation of the Power Clock," Adiabatic Logic: Future Trend and System Level Perspective, Springer Series in Advanced Microelectronics, vol. 34, 2012, Springer, p. 65.
International Search Report and Written Opinion for PCT/US2017/041629, dated Oct. 30, 2017, 17 pages.
International Preliminary Report on Patentability for PCT/US2017/041629, dated Oct. 15, 2018, 24 pages.
Second Written Opinion for PCT/US2017/041629, dated Jul. 17, 2018, 11 pages.

* cited by examiner

ELECTRONIC DEVICES EMPLOYING ADIABATIC LOGIC CIRCUITS WITH WIRELESS CHARGING

BACKGROUND

I. Field of the Disclosure

The technology of the disclosure relates generally to adiabatic logic circuits, and particularly to charging electronic devices employing adiabatic logic circuits.

II. Background

As the prevalence and complexity of functions performed using mobile or battery powered electronic devices continues to increase, so too does the demand for reduced power consumption. One way to reduce the power consumption of electronic devices is to employ circuits designed using adiabatic logic. Adiabatic logic refers to low-power logic circuits that implement reversible logic designed to lose less energy to heat dissipation compared to conventional complementary metal oxide semiconductor (CMOS) circuits. More specifically, CMOS transistors dissipate power while switching logic states. A portion of such heat dissipation in a CMOS transistor is attributable to the need to charge and discharge a gate capacitance (C) of the CMOS transistor through a component having resistivity (R). For example, energy (E) dissipated while a gate capacitance (C) of a CMOS transistor charges is calculated using the equation $E=((RC)/T)*CV^2$. In this equation, T represents the time needed to charge or discharge the gate capacitance (C), and V represents the corresponding voltage.

In this regard, adiabatic logic lengthens the charging time (T) of the gate capacitance (C) so as to reduce dissipated energy (E), thus reducing power consumption. To lengthen the charging time (T) in this manner, adiabatic logic is designed based on two functionality principles. First, transistors employed in adiabatic logic circuits are not activated while there is a potential difference between a source and a drain (e.g., when there is a voltage difference between the high voltage and low voltage rails). This allows energy to flow through an activated transistor in an adiabatic logic circuit in a gradual and controlled manner. Second, transistors employed in adiabatic logic are not deactivated while current is flowing through the transistor, allowing for a gradual transition of states rather than losing energy (E) through heat dissipation.

Although adiabatic logic can reduce power consumption of a corresponding electronic device, powering adiabatic logic circuits can be difficult. For example, FIG. 1 illustrates an exemplary adiabatic logic circuit 100 designed to generate an output Q equal to [(input X AND input Y) OR input Z] (i.e., XY+Z) by employing transistors 104(1)-104(8). To achieve the gradual charging and discharging described above, the adiabatic logic circuit 100 is powered by providing a sinusoidal power-clock PC to a power rail 102. In this manner, the sinusoidal power-clock PC is provided to each respective source (S) of the transistors 104(1)-104(6). Sinusoidal power-clocks such as the sinusoidal power-clock PC can be generated using micro electro-mechanical systems (MEMS) resonance or multi-step VDD power hopping, for example. However, such methods are complex and correspond to higher power consumption compared to the power needed to operate the corresponding electronic device.

SUMMARY OF THE DISCLOSURE

Aspects disclosed herein include electronic devices employing adiabatic logic circuits with wireless charging. Electronic devices that employ adiabatic logic circuits may consume less power compared to devices that employ conventional complementary metal oxide semiconductor (CMOS) logic circuits configured to achieve similar functionality. However, circuitry designed to generate an alternating current (AC) signal used to power adiabatic logic circuits conventionally correspond to higher power consumption compared to the power needed to operate the corresponding electronic device. In this manner, in one aspect, an electronic device employing an adiabatic logic circuit with wireless charging is provided. The electronic device includes a power circuit employing an AC coupler circuit configured to receive a wireless AC signal and generate a wired AC signal based on the wireless AC signal. The power circuit also includes a power output configured to provide an AC power signal based on the wired AC signal generated by the AC coupler circuit. In this manner, the AC power signal is generated based on the wireless charging capability of the AC coupler circuit. Additionally, the electronic device employs a digital logic system that includes a power rail electrically coupled to an adiabatic logic circuit. The AC power signal is provided to the power rail so as to provide power to the adiabatic logic circuit. Employing the AC coupler circuit to wirelessly charge the adiabatic logic circuit consumes less power than conventional non-wireless charging circuitry, such as micro electro-mechanical systems (MEMS) resonance circuitry, for example. Thus, the electronic device can achieve the lower power consumption of adiabatic logic while avoiding the higher power consumption attributable to generating the needed power signal using non-wireless charging options.

In this regard in one aspect, an electronic device is provided. The electronic device comprises a power circuit. The power circuit comprises an AC coupler circuit configured to receive a wireless AC signal and generate a wired AC signal based on the wireless AC signal. The power circuit further comprises a power output configured to provide an AC power signal based on the wired AC signal. The electronic device further comprises a digital logic system. The digital logic system comprises a power input electrically coupled to the power output. The digital logic system further comprises a power rail electrically coupled to the power input. The digital logic system further comprises an adiabatic logic circuit electrically coupled to the power rail.

In another aspect, an electronic device is provided. The electronic device comprises a means for receiving a wireless AC signal. The electronic device further comprises a means for generating a wired AC signal based on the wireless AC signal. The electronic device further comprises a means for providing an AC power signal based on the wired AC signal to an adiabatic logic circuit.

In another aspect, a method for wirelessly charging an adiabatic logic circuit is provided. The method comprises receiving a wireless AC signal. The method further comprises generating a wired AC signal based on the wireless AC signal. The method further comprises providing an AC power signal based on the wired AC signal to an adiabatic logic circuit.

DETAILED DESCRIPTION

Figure 1:
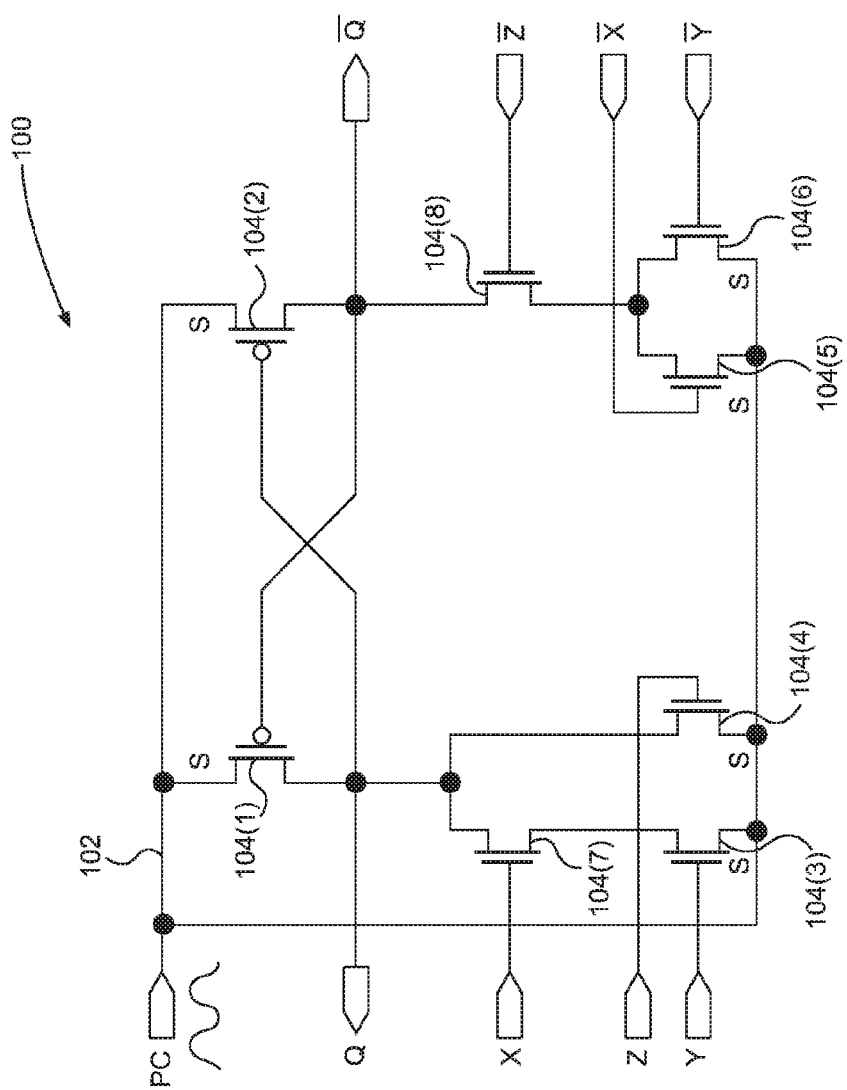
FIG. 1 is a block diagram of an exemplary adiabatic logic circuit.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include electronic devices employing adiabatic logic circuits with wireless charging. Electronic devices that employ adiabatic logic circuits may consume less power compared to devices that employ conventional complementary metal oxide semiconductor (CMOS) logic circuits configured to achieve similar functionality. However, circuitry designed to generate an alternating current (AC) signal used to power adiabatic logic circuits conventionally correspond to higher power consumption compared to the power needed to operate the corresponding electronic device. In this manner, in one aspect, an electronic device employing an adiabatic logic circuit with wireless charging is provided. The electronic device includes a power circuit employing an AC coupler circuit configured to receive a wireless AC signal and generate a wired AC signal based on the wireless AC signal. The power circuit also includes a power output configured to provide an AC power signal based on the wired AC signal generated by the AC coupler circuit. In this manner, the AC power signal is generated based on the wireless charging capability of the AC coupler circuit. Additionally, the electronic device employs a digital logic system that includes a power rail electrically coupled to an adiabatic logic circuit. The AC power signal is provided to the power rail so as to provide power to the adiabatic logic circuit. Employing the AC coupler circuit to wirelessly charge the adiabatic logic circuit consumes less power than conventional non-wireless charging circuitry, such as micro electro-mechanical systems (MEMS) resonance circuitry, for example. Thus, the electronic device can achieve the lower power consumption of adiabatic logic while avoiding the higher power consumption attributable to generating the needed power signal using non-wireless charging options.

Figure 2:
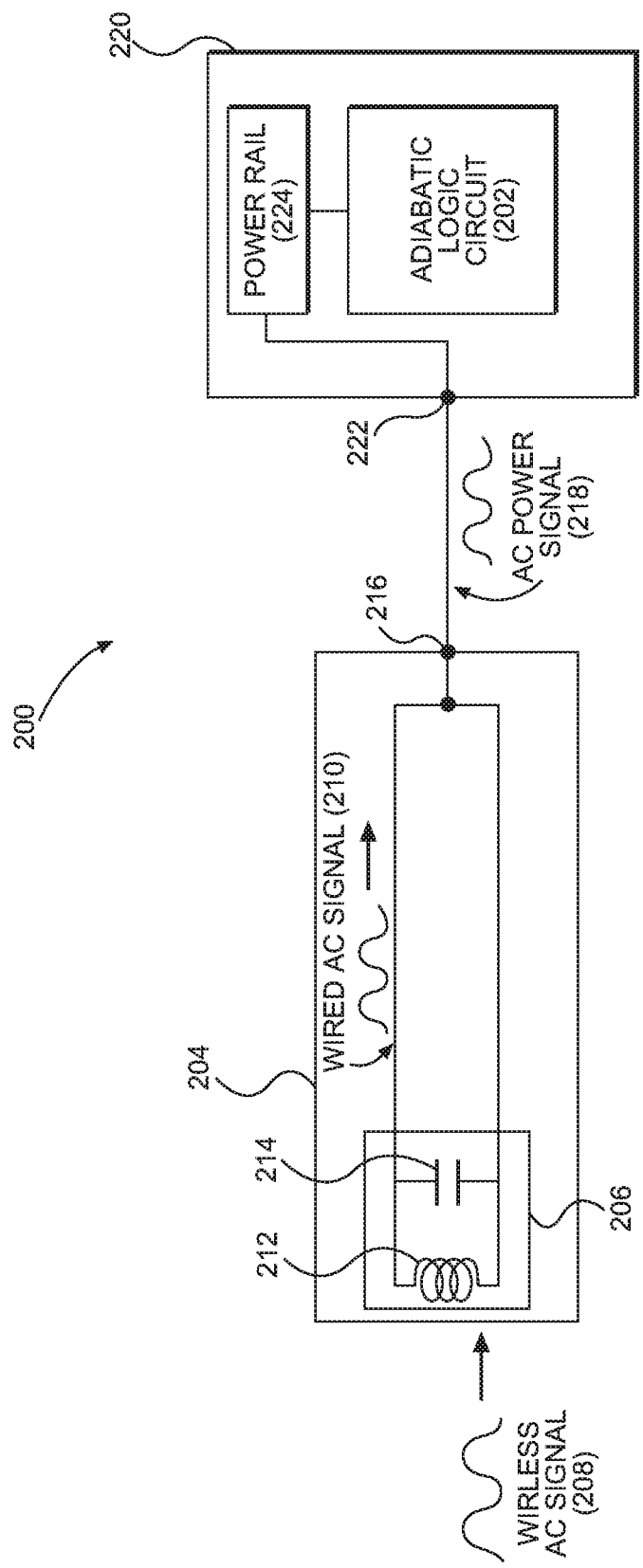
FIG. 2 is a block diagram of an exemplary electronic device employing an adiabatic logic circuit with wireless charging.

In this regard, FIG. 2 illustrates an exemplary electronic device 200 employing an adiabatic logic circuit 202 with wireless charging. The electronic device 200 includes a power circuit 204 employing an AC coupler circuit 206. The AC coupler circuit 206 is configured to receive a wireless AC signal 208 and generate a wired AC signal 210 based on the wireless AC signal 208. In this example, the AC coupler circuit 206 employs an inductive coil 212 electrically coupled in parallel with a capacitor 214, such that the inductive coil 212 generates the wired AC signal 210 in response to receiving the wireless AC signal 208. The power circuit 204 also includes a power output 216 configured to provide an AC power signal 218 that is based on the wired AC signal 210, such that the AC power signal 218 is generated based on the wireless charging capability of the AC coupler circuit 206. In this example, the AC power signal 218 provided by the power output 216 is substantially equivalent to the wired AC signal 210.

With continuing reference to FIG. 2, the electronic device 200 also employs a digital logic system 220 that employs the adiabatic logic circuit 202. Although only one adiabatic logic circuit 202 is included in this aspect, other aspects may employ multiple adiabatic logic circuits 202. To provide power to (i.e., charge) the adiabatic logic circuit 202, the digital logic system 220 includes a power input 222 electrically coupled to the power output 216. Additionally, the power input 222 is electrically coupled to a power rail 224 employed by the digital logic system 220. The power rail 224 is electrically coupled to the adiabatic logic circuit 202. In this manner, the AC power signal 218 is provided to the power rail 224 via the power input 222 such that the AC power signal 218 powers the adiabatic logic circuit 202. In this example, the adiabatic logic circuit 202 may be powered by multiple types of AC signals, and thus, the AC power signal 218 can include variously shaped waveforms such as a sinusoidal shape or a trapezoidal shape, for example. Employing the AC coupler circuit 206 to wirelessly charge the adiabatic logic circuit 202 consumes less power than conventional non-wireless charging circuitry. Thus, the electronic device 200 can achieve the lower power consumption of the adiabatic logic circuit 202 while avoiding the higher power consumption attributable to generating the AC power signal 218 corresponding to non-wireless charging circuitry, such as micro electro-mechanical systems (MEMS) resonance, for example.

Figure 3:
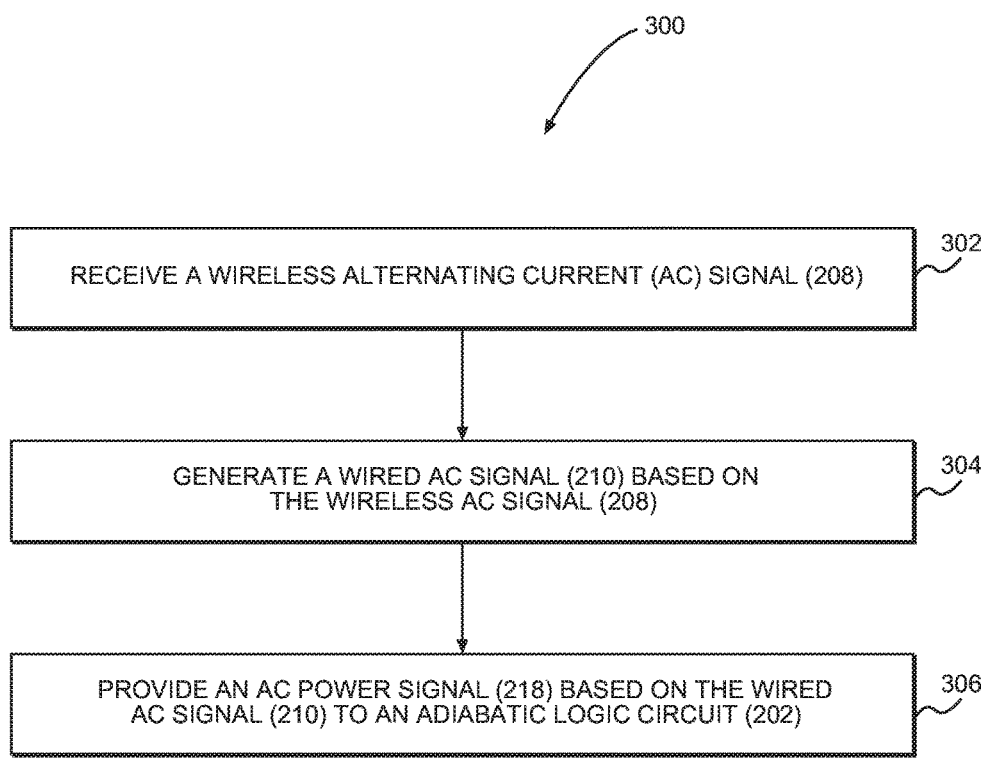
FIG. 3 is a flowchart illustrating an exemplary process employed by the electronic device to wirelessly charge the adiabatic logic circuit in FIG. 2.

FIG. 3 illustrates an exemplary process 300 the electronic device 200 in FIG. 2 employs to wirelessly charge the adiabatic logic circuit 202. The process 300 includes receiving the wireless AC signal 208 via the AC coupler circuit 206 (block 302). The process 300 also includes generating the wired AC signal 210 based on the wireless AC signal 208 (block 304). Further, the process 300 includes providing the AC power signal 218 based on the wired AC signal 210 to the adiabatic logic circuit 202 (block 306). Employing the process 300 to wirelessly charge the adiabatic logic circuit 202 in this manner helps the electronic device 200 to realize the lower power consumption benefits of the adiabatic logic circuit 202 without incurring the higher power consumption associated with non-wireless charging circuitry.

Figure 4:
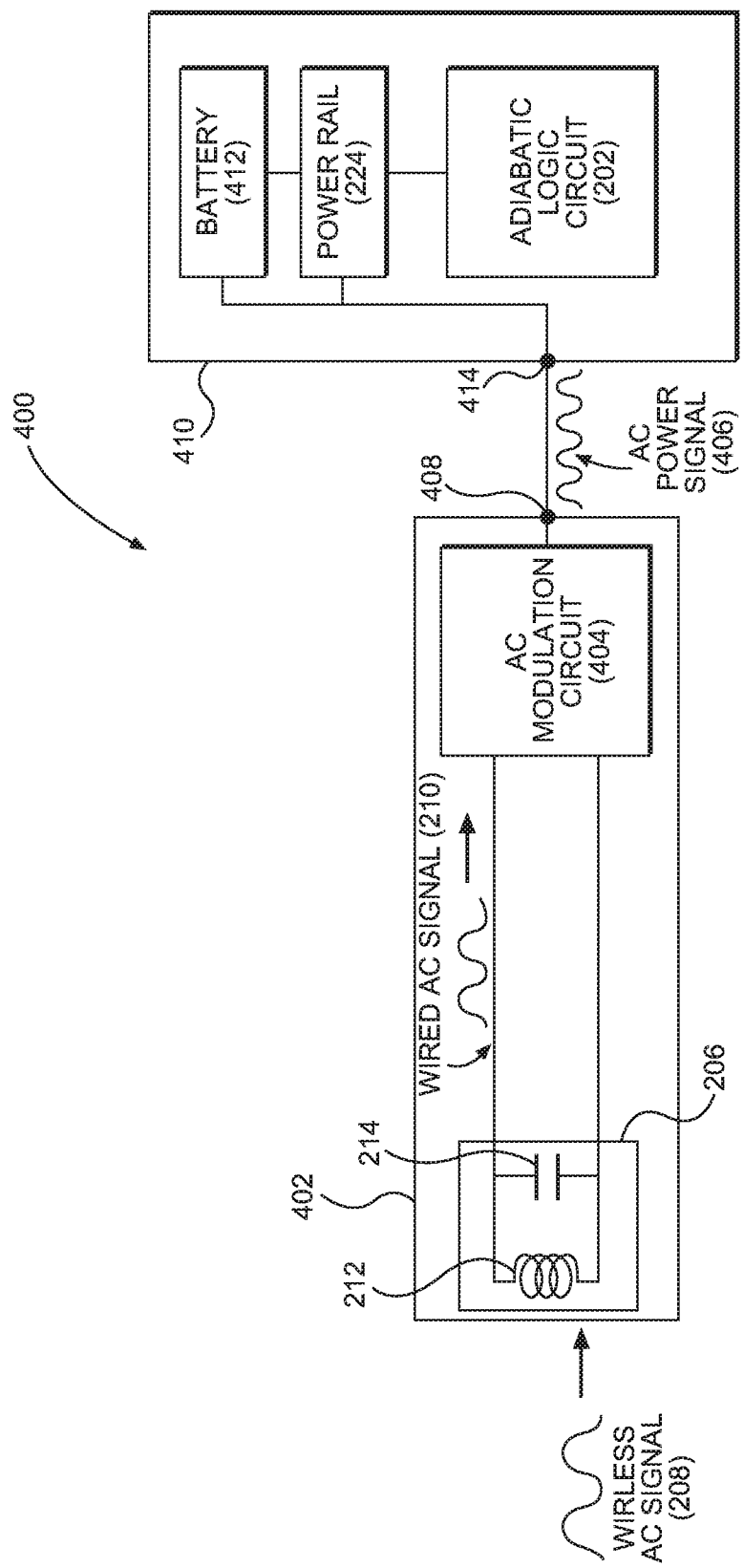
FIG. 4 is a block diagram of an exemplary electronic device employing an adiabatic logic circuit with wireless charging, wherein a wired alternating current (AC) signal used to power the adiabatic logic circuit can be modulated and/or stored in a battery.

In addition to the elements described in the electronic device 200 in FIG. 2, additional circuit elements can be employed to assist in the wireless charging of adiabatic logic. In this manner, FIG. 4 illustrates an exemplary electronic device 400. The electronic device 400 includes certain common components with the electronic device 200 in FIG. 2, as shown by similar element numbers between FIGS. 2 and 4, and thus will not be re-described herein.

With continuing reference to FIG. 4, the electronic device 400 employs a power circuit 402 that includes an AC modulation circuit 404 in addition to the AC coupler circuit 206. The AC modulation circuit 404 is configured to generate an AC power signal 406 on a power output 408 based on the wired AC signal 210. However, in addition to generating the AC power signal 406 to be substantially equivalent to the wired AC signal 210, the AC modulation circuit 404 is also configured to generate the AC power signal 406 by adjusting an amplitude and/or frequency of the wired AC signal 210. In this manner, the AC modulation circuit 404 may increase or decrease an amplitude of the wired AC signal 210 to generate the AC power signal 406. Additionally, the AC modulation circuit 404 may increase or decrease a frequency of the wired AC signal 210 to generate the AC power signal 406. For example, the AC modulation circuit 404 can be configured to adjust the frequency of the wired AC signal 210 to match a frequency of logic inputs provided to the adiabatic logic circuit 202.

In this manner, generating the AC power signal 406 by modulating the amplitude and/or frequency of the wired AC signal 210 enables the power circuit 402 to charge the adiabatic logic circuit 202 according to particular power requirements needed to achieve desired functionality. For example, the electronic device 400 may be an Internet of Things (IoT) device or a wearable device, such as a hearing aid or pacemaker. Thus, the AC modulation circuit 404 can adjust the amplitude and/or frequency of the wired AC signal 210 such that the AC power signal 406 conforms to the design and power requirements of such devices. For example, if the electronic device 400 is a pacemaker, the AC power signal 406 may be generated to have a frequency between approximately one (1) kilohertz (kHz) and ten (10) MHz, and an amplitude between approximately one hundred (100) millivolts (mV) and 10 volts (V) so as to meet the specifications of such a device.

With continuing reference to FIG. 4, the electronic device 400 employs a digital logic system 410 that includes a battery 412 in addition to the adiabatic logic circuit 202 and the power rail 224. The battery 412 is electrically coupled to a power input 414 of the digital logic system 410 and the power rail 224. In this manner, the battery 412 can store excess charge provided by the AC power signal 406 not otherwise consumed by the adiabatic logic circuit 202 during operation. For example, the AC power signal 406 may provide charge to the battery 412 while the adiabatic logic circuit 202 is in an idle or off state. Further, the battery 412 may store charge if the charge provided by the AC power signal 406 is greater than the charge needed to power current operation of the adiabatic logic circuit 202. Employing the battery 412 in this manner allows the electronic device 400 to operate using the wireless charging provided by the AC coupler circuit 206 even when no wireless AC signal 208 is present.

Figure 5:
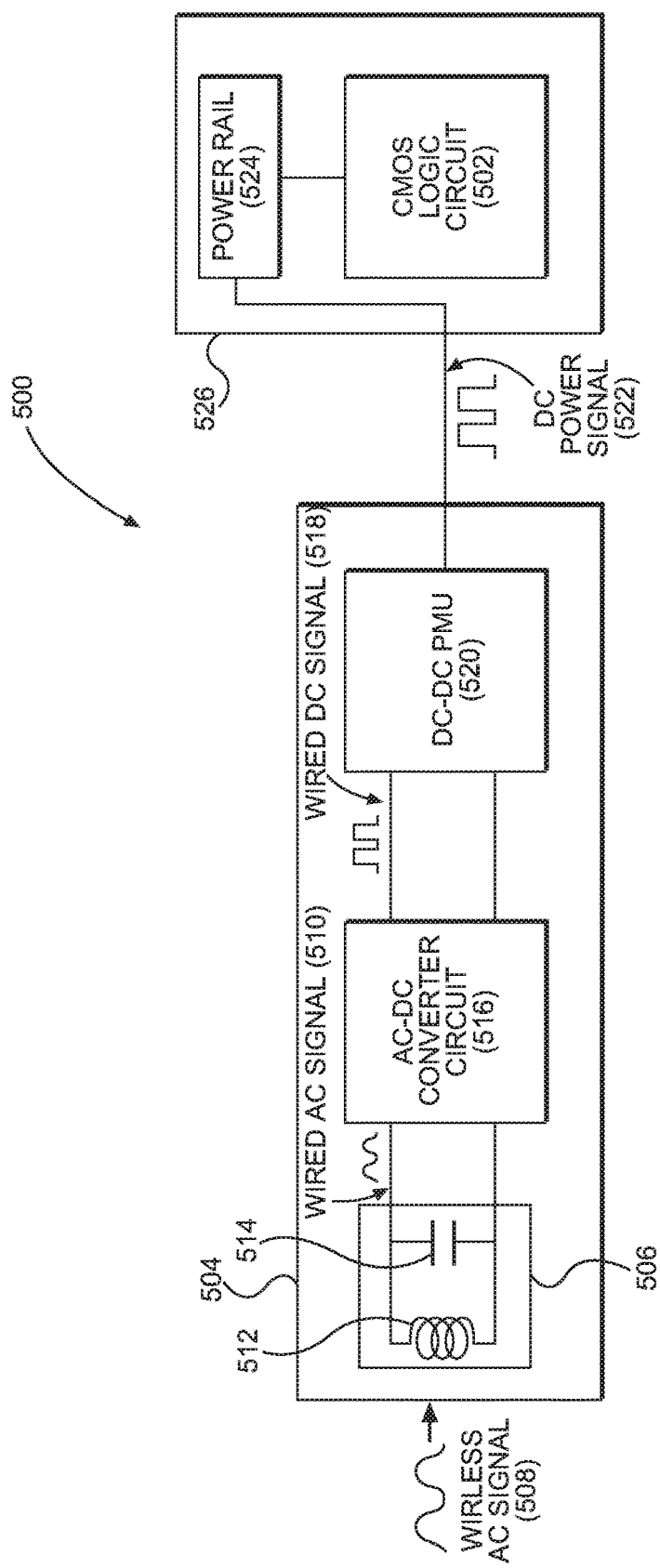
FIG. 5 is a block diagram of a conventional electronic device employing a conventional complementary metal oxide semiconductor (CMOS) logic circuit with wireless charging.

To further explain the benefits provided by the aspects disclosed herein, FIG. 5 illustrates a conventional electronic device 500 employing a conventional complementary metal oxide semiconductor (CMOS) logic circuit 502 with wireless charging. The electronic device 500 includes a power circuit 504 employing an AC coupler circuit 506. The AC coupler circuit 506 is configured to receive a wireless AC signal 508 and generate a wired AC signal 510. In this example, the AC coupler circuit 506 employs an inductive coil 512 electrically coupled in parallel with a capacitor 514. However, rather than providing the wired AC signal 510 to the power output 408 or the AC modulation circuit 404 as in FIG. 4, the power circuit 504 includes an AC to direct current (DC) converter circuit 516 configured to convert the wired AC signal 510 into a wired DC signal 518. Further, the wired DC signal 518 is provided to a DC-DC power management unit (PMU) 520 that is configured to provide a DC power signal 522 to a power rail 524 electrically coupled to the conventional CMOS logic circuit 502 employed in a digital logic system 526.

In this manner, with continuing reference to FIG. 5, rather than being configured to receive the AC power signal 406 similar to the electronic device 400 in FIG. 4, the conventional CMOS logic circuit 502 is powered using the DC power signal 522. Due to this difference in the adiabatic logic circuit 202 in FIG. 4 and the conventional CMOS logic circuit 502, the electronic device 400 is able to forego employing the AC-DC converter circuit 516. Thus, employing adiabatic logic with wireless charging in aspects disclosed herein may enable an electronic device to consume less area due to absence of an AC-DC converter circuit that is needed when employing conventional CMOS logic. Such area savings are in addition to the reduced power consumption provided by adiabatic logic compared to conventional CMOS logic.

The elements described herein are sometimes referred to as means for achieving a particular property. In this regard the AC coupler circuit 206 is sometimes referred to herein as "a means for receiving a wireless AC signal." The AC coupler circuit 206 is also sometimes referred to herein as "a means for generating a wired AC signal based on the wireless AC signal." The power output 216 is sometimes referred to herein as "a means for providing an AC power signal based on the wired AC signal to an adiabatic logic circuit."

The electronic devices employing adiabatic logic circuits with wireless charging according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a server, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 6:
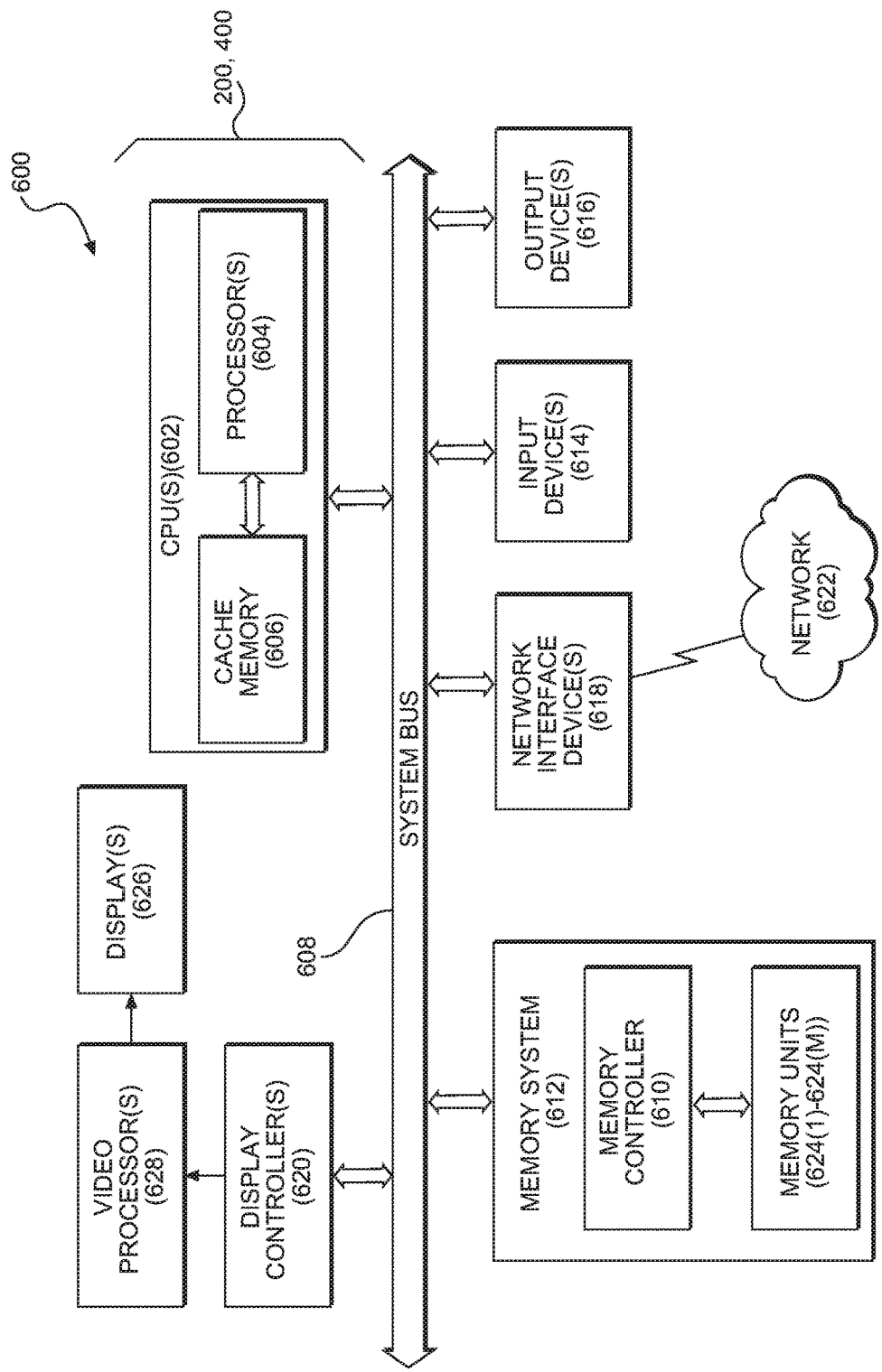
FIG. 6 is a block diagram of an exemplary processor-based system that can include the electronic devices employing the adiabatic logic circuit with wireless charging in FIGS. 2 and 4.

In this regard, FIG. 6 illustrates an example of a processor-based system 600 that can employ the electronic devices 200, 400 illustrated in FIGS. 2 and 4, respectively. In this example, the processor-based system 600 includes one or more central processing units (CPUs) 602, each including one or more processors 604. The CPU(s) 602 may have cache memory 606 coupled to the processor(s) 604 for rapid access to temporarily stored data. The CPU(s) 602 is coupled to a system bus 608 and can intercouple master and slave devices included in the processor-based system 600. As is well known, the CPU(s) 602 communicates with these other devices by exchanging address, control, and data information over the system bus 608. For example, the CPU(s) 602 can communicate bus transaction requests to a memory controller 610 as an example of a slave device. Although not illustrated in FIG. 6, multiple system buses 608 could be provided, wherein each system bus 608 constitutes a different fabric.

Other master and slave devices can be connected to the system bus 608. As illustrated in FIG. 6, these devices can include a memory system 612, one or more input devices 614, one or more output devices 616, one or more network interface devices 618, and one or more display controllers 620, as examples. The input device(s) 614 can include any type of input device, including, but not limited to, input keys, switches, voice processors, etc. The output device(s) 616 can include any type of output device, including, but not limited to, audio, video, other visual indicators, etc. The network interface device(s) 618 can be any device configured to allow exchange of data to and from a network 622.

The network 622 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 618 can be configured to support any type of communications protocol desired. The memory system 612 can include one or more memory units 624(1)-624(M).

The CPU(s) 602 may also be configured to access the display controller(s) 620 over the system bus 608 to control information sent to one or more displays 626. The display controller(s) 620 sends information to the display(s) 626 to be displayed via one or more video processors 628, which process the information to be displayed into a format suitable for the display(s) 626. The display(s) 626 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An electronic device, comprising:
   a power circuit, comprising:
     an alternating current (AC) coupler circuit configured to:
       receive a wireless AC signal; and
       generate a wired AC signal based on the wireless AC signal; and
     a power output configured to provide an AC power signal based on the wired AC signal; and
   a digital logic system, comprising:
     a power input electrically coupled to the power output;
     a power rail electrically coupled to the power input; and
     an adiabatic logic circuit electrically coupled to the power rail.

2. The electronic device of claim 1, wherein the electronic device does not employ an AC to direct current (DC) (AC-DC) converter circuit.

3. The electronic device of claim 1, wherein the power circuit further comprises an AC modulation circuit configured to:
   receive the wired AC signal; and
   generate the AC power signal comprising the wired AC signal with an adjusted amplitude.

4. The electronic device of claim 3, wherein the AC modulation circuit is further configured to generate the AC power signal comprising the wired AC signal with an adjusted frequency.

5. The electronic device of claim 4, wherein the AC modulation circuit is further configured to generate the AC power signal comprising the wired AC signal with the adjusted frequency approximately matched to a frequency of logic inputs provided to the adiabatic logic circuit.

6. The electronic device of claim 1, wherein the power circuit further comprises a battery electrically coupled to the power input and the power rail.

7. The electronic device of claim 1 configured as a wearable device.

8. The electronic device of claim 7, wherein the wearable device comprises a pacemaker.

9. The electronic device of claim 7, wherein the wearable device comprises a hearing aid.

10. The electronic device of claim 1, wherein the AC coupler circuit comprises an inductive coil configured to generate the wired AC signal in response to receiving the wireless AC signal.

11. The electronic device of claim 1, wherein the AC power signal comprises a sinusoidal-shaped AC signal.

12. The electronic device of claim 1, wherein the AC power signal comprises a trapezoidal-shaped AC signal.

13. The electronic device of claim 1 integrated into an integrated circuit (IC).

14. The electronic device of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a server; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

* * * * *